US00RE39640E

(19) United States
(12) Reissued Patent
Kanatzidis et al.

(10) Patent Number: US RE39,640 E
(45) Date of Reissued Patent: May 22, 2007

(54) CONDUCTIVE ISOSTRUCTURAL COMPOUNDS

(75) Inventors: Mercouri G. Kanatzidis, Okemos, MI (US); Duck-Young Chung, Haslett, MI (US); Stephane DeNardi, L'Isle-En-Dodon (FR); Sandrine Sportouch, Lansing, MI (US)

(73) Assignee: Board of Trustees operating Michigan State University, East Lansing, MI (US)

(21) Appl. No.: 10/703,026

(22) Filed: Nov. 6, 2003

Related U.S. Patent Documents

Reissue of:
(64) Patent No.: 6,312,617
Issued: Nov. 6, 2001
Appl. No.: 09/416,165
Filed: Oct. 11, 1999

U.S. Applications:
(60) Provisional application No. 60/103,961, filed on Oct. 13, 1998.

(51) Int. Cl.
*H01L 29/15* (2006.01)

(52) U.S. Cl. ..... 252/62.3 T; 252/62.3 V; 252/519.4; 136/238; 136/239; 136/240; 136/241; 136/259; 136/261; 136/264; 257/65; 257/431; 257/467; 257/613; 250/338.4; 250/370.14

(58) Field of Classification Search ..... 423/508, 423/511; 252/519.4, 62.3 T, 62.3 V; 250/338.4, 250/370.14, 370.12; 257/431, 467, 615, 614; 136/238–240, 259, 261, 264, 265
See application file for complete search history.

(56) References Cited

U.S. PATENT DOCUMENTS

| | | | |
|---|---|---|---|
| 2,602,095 | A | 7/1952 | Faus |
| 2,728,637 | A | 12/1955 | Alderson et al. |
| 2,770,528 | A | 11/1956 | Maynard |
| 2,882,467 | A | 4/1959 | Wernick |

(Continued)

OTHER PUBLICATIONS

Borissova et al., "Thermoelectric properties of materials based on PbTe and GeTe", Chapter 15, pp. 171–177, date unknown.

(Continued)

*Primary Examiner*—C. Melissa Koslow
(74) *Attorney, Agent, or Firm*—Harness, Dickey & Pierce, P.L.C.

(57) ABSTRACT

A family of isostructural compounds have been prepared having the general formula $A_nPb_mBi_nO_{2n+m}$. These compounds possess a NaCl lattice type structure as well as low thermal conductivity and controlled electrical conductivity. Furthermore, the electrical properties can be controlled by varying the values for n and m. These isostructural compounds can be used for semiconductor applications such as detectors, lasers and photovoltaic cells. These compounds also have enhanced thermoelectric properties making them excellent semiconductor materials for fabrication of thermoelectric devices.

74 Claims, 8 Drawing Sheets

U.S. PATENT DOCUMENTS

| | | | | | |
|---|---|---|---|---|---|
| 2,882,468 | A | | 4/1959 | Wernick | |
| 3,008,797 | A | | 4/1961 | Bither | |
| 2,995,613 | A | * | 8/1961 | Wernick | 136/203 |
| 3,211,655 | A | * | 10/1965 | Fleischmann | 252/62.3 T |
| 3,211,656 | A | * | 10/1965 | Rupprecht | 252/62.3 T |
| 3,238,134 | A | * | 3/1966 | Fleischmann | 252/62.3 T |
| 3,318,669 | A | | 5/1967 | Folberth | |
| 3,945,855 | A | * | 3/1976 | Skrabek et al. | 136/238 |
| 5,187,052 | A | | 2/1993 | Maeda et al. | |
| 5,368,701 | A | | 11/1994 | Warren et al. | |
| 5,448,109 | A | | 9/1995 | Cauchy | |
| 5,610,366 | A | * | 3/1997 | Fleurial et al. | 136/202 |
| 5,708,233 | A | * | 1/1998 | Ochi et al. | 136/238 |
| 5,719,390 | A | * | 2/1998 | Tateishi et al. | 250/207 |
| 5,726,381 | A | * | 3/1998 | Horio et al. | 136/236.1 |
| 5,773,829 | A | * | 6/1998 | Iwanczyk et al. | 250/367 |
| 5,936,193 | A | * | 8/1999 | Parise | 136/205 |
| 6,034,318 | A | | 3/2000 | Lycke et al. | |
| 6,103,967 | A | | 8/2000 | Cauchy et al. | |
| 6,129,673 | A | * | 10/2000 | Fraden | 600/474 |
| 6,313,393 | B1 | | 11/2001 | Drost | |
| 6,342,668 | B1 | | 1/2002 | Fleurial et al. | |
| 6,444,894 | B1 | | 9/2002 | Sterzel | |
| 2005/0076944 | A1 | * | 4/2005 | Kanatzidis et al. | 136/239 |

OTHER PUBLICATIONS

Brixner, L. H., "Note on Schirmerite", Pigments Department, Experimental Station, E. I. du Pont de Nemours & Co., Inc., Mineralogical Notes, The American Mineralogist, vol. 50, pp. 259–261, Jan.–Feb., 1965.

Busch et al., English Abstract of German Journal: "Minerals as prototypes for new semiconductor compounds", includes document., Bldg. Tech. Hochschule, Zurich, Switzerland, Helv. Phys. Acta., 33, pp. 657–666, 1960 and copy of German article.

Fleischmann, H., English Excerpt Translation of "Heat Conductivity, Thermopower and Electric Conductivity of Semiconductive Mixed Crystals of the $(A_{x/2^I}B_{1-x^{II}}C_{x/2^V})D^{IV}$ Form" Zeitschrift fur Naturforschung, and German Document, pp. 765–780, Jun., 1961.

Goryunova, et al., English Abstract of Russian Journal: "Possibility of formation of solid solutions in some quaternary systems", Vestnik Leningrad. Univ., pp. 156–158, 1961 and copy of Russian article.

Hsu, Kuei Fang et al., "Cubic AgPvmSbTe2+m: Bulk Thermoelectric Materials with High Figure of Merit", SCIENCE, vol. 303, No. 5689, Feb. 6, 2004 (Feb. 6, 2004), pp. 818–821, XP 002328052, ISSN: 0036–8075 (includes XP–002328054 Abstract).

Hsu, Kuei–Fang et al., "Thermoelectric Properties of the cubic AgPb0SbTe12" Abstract, Thermoelectric Materials 2003—Research and Applications Symposium, Dec. 1–3, 2003, Boston, MA, USA, XP002328055; ISBN: 1–55899–731–8, (1 pg.).

Hsu, Kuei–Fang et al., Thermoelectric Properties of the cubic AgPb0SbTe12, XP002320053, Mat. Res. Soc. Symp. Proc. vol. 793, 2004 Materials Research Society, pp. S6.3.1–S6.3.6.

Lawson et al., English Abstract of Journal only: "Preparation and properties of HgTe and mixed crystals of HgTe–CdTe", Lawson et al., Phys. and Chem Solids, 9, 1959, (1 pg.).

Losev, S. A., English Abstract of Journal only: "Equilibrium state of a gas behind a shock wave in oxygen, nitrogen, and their mixtures with xenon", Vestnik Moskov. Univ. Fiz., Astron., No. 5, 1960.

Plust et al., English Abstract: "Electron–microscope investigation of some new poly morphic thermoelectric compounds", Schweiz. Arch. Angew. Wiss. Techn., pp. 458–460, Nov. 1961 and copy of German article, (1 pg).

Wernick, J. H., "Metallurgy of Some Ternary Semiconductors and Constitution of the $AgSbSe_2$–$AgSbTe_2$–AgBiSe–PbSe–PbTe System", Bell Telephone Laboratories, Inc., Murray Hill, New Jersey, pp. 69–88, date unknown.

* cited by examiner

CONDUCTIVE ISOSTRUCTURAL COMPOUNDS

Matter enclosed in heavy brackets [ ] appears in the original patent but forms no part of this reissue specification; matter printed in italics indicates the additions made by reissue.

This is a regular application of provisional application Ser. No. 60/103,961 filed Oct. 13, 1998.

SPONSORSHIP

Work on this invention was sponsored in part by the Office of Naval Research, Grants N00014-94-1-0935 and N00014-98-1-0443 and Defense Advanced Research Projects Agency Grant DAAG55-97-1-0184. The Government may have certain rights to the invention.

FIELD OF THE INVENTION

This invention relates generally to new compounds exhibiting crystal lattice morphologies and, more particularly, to conductive compounds having NaCl-type cubic crystal lattice structures.

BACKGROUND OF THE INVENTION

Semiconductor materials are at the core of current technological infrastructure and continuing advancements. Various semiconductors enable many technologies. For example, Si and Ge enable high speed computing, GaAs, InSb and their derivatives enable optoelectronics and communication devices, Si and GaAs are the vital components of solar energy converters, GaN and GaAs alloys enable solid state lasers, $Bi_2Te_3$ alloys enable thermoelectric cooling, and PbS, PbSe and HgCdTe are used in medium and long wavelength radiation detection.

Semiconductor materials used in solid state lasers, photovoltaic cells, optoelectronic devices and radiation detection, for example, must not only be excellent electronic conductors, but also have the appropriate energy band configuration or "band gap" for those applications. As more than one material is used in layers, the difference in the band gap between the various semiconductor materials used is also critical. For example, photovoltaic cells can use two semiconductor materials to produce a rectifying heterojunction. The advantages of utilizing this design include the ability to choose materials with properties appropriate for each component of the device and the reduced necessity for compromise with the property requirements of other components of the device. An example of this is the use of a wide band gap "window" semiconductor material as a barrier layer on a more narrow band gap "absorber" semiconductor material. The amount of radiation absorbed and therefore the electrical current generated in the device, increases with the decreasing band gap width, while the diffusion potential obtainable within the device, and therefore the electrical voltage generated in the device, increases with band gap width. Thus, the absorber material is chosen to maximize the solar radiation absorbed and affords a reasonable diffusion potential, while window material is chosen to absorb a minimum amount of solar radiation. Therefore, the closer the actual band gap to the desired, theoretical band gap of the semiconductor materials, the more efficient the photovoltaic cell. Many current semiconductor materials are limited in that they do not allow for fine adjustment of the band gap. Furthermore, some semiconductor materials contain volatile elements causing changes in the composition of the materials and consequently unwanted changes in the band gap.

In thermoelectric devices, it is also critical to have semiconductor materials that have specific properties. Such devices may be used for heating, cooling, temperature stabilization, power generation and temperature sensing. Modern thermoelectric coolers typically include an array of thermocouples.

Thermoelectric devices are essentially heat pumps and power generators which follow the laws of thermodynamics in the same manner as mechanical heat pumps, refrigerators, or any other apparatus used to transfer heat energy. The efficiency of a thermoelectric device is generally limited to its associated Carnot cycle efficiency reduced by a factor which is dependent upon the thermoelectric figure of merit (zT) of the materials used in fabrication of the thermoelectric device. The figure of merit represents the coupling between electrical and thermal effects in a material. The basic thermoelectric effects are the Seebeck and Peltier effects. The Seebeck effect is the phenomenon underlying the conversion of heat energy into electrical power and is used in thermoelectric power generation. The complementary effect, the Peltier effect, is the phenomenon used in thermoelectric refrigeration and is related to heat absorption accompanying the passage of current through the junction of two dissimilar materials.

While thermoelectric materials such as alloys of $Bi_2Te_3$, PbTe and BiSb were developed thirty to forty years ago, the efficiency of such thermoelectric devices remains relatively low at approximately five to eight percent energy conversion efficiency.

Therefore it would be desirable to have semiconductor materials that are not only good conductors but have a range of band gaps to fit a wide number of applications. It would be further desirable to have materials in which the band gaps could be adjusted to give the desired band gap for the appropriate application. These materials should also be thermal and chemically stable.

Furthermore, it would be desirable to have thermoelectric materials that have a high thermoelectric figure of merit. Use of such materials would produce thermoelectric devices with high efficiencies.

SUMMARY OF THE INVENTION

The present invention relates to new isostructural compounds having the general formula $A_nM_mM'_nO_{2n+m}$ where A is an alkali metal, such as lithium (Li), sodium (Na), potassium (K), rubidium (Rb), or cesium (Cs) or the transition metal silver (Ag) or thallium (Tl) and mixtures thereof, M is lead (Pb), tin (Sn), germanium (Ge), calcium (Ca), strontium (Sr), barium (Ba), any divalent transition metal or mixtures thereof, M' is bismuth (Bi), antimony (Sb) or mixtures thereof, and Q is sulfur (S), selenium (Se), or tellurium (Te) and mixtures thereof. These compounds possess an NaCl-type cubic lattice crystal structure where A, M and M' occupy the Na sites and Q occupies the Cl (chlorine) sites. This family of compounds combine isotropic morphology, an advantageous property for device processing, with low thermal conductivity and widely ranged electrical conductivity. Further, certain properties such as the electrical properties of the compounds can be controlled by varying the values for n and m. The isostructural compounds of the present invention are therefore good candidates for semiconductor applications in thermoelectronic devices, detectors, and photovoltaic cells, by way of non-limiting example.

Additional objects, advantages, and features of the present invention will become apparent from the following description and appended claims, taken in conjunction with the accompanying drawings.

DETAILED DESCRIPTION OF THE PREFERRED EMBODIMENTS

Figure 1:
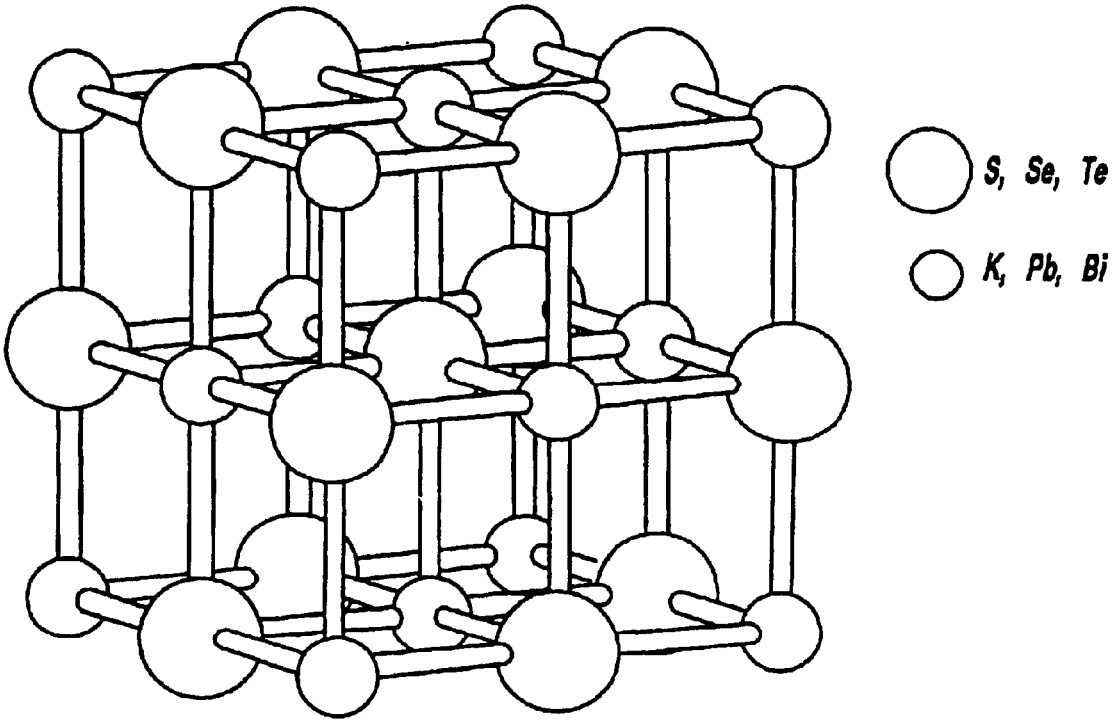
FIG. 1 is an illustration of the crystal structure of $A_nPb_mBi_nO_{2n+m}$.

The present invention provides new isostructural compounds having the general formula $A_nM_mM'_nO_{2n+m}$ where A is an alkali metal, such as lithium (Li), sodium (Na), potassium (K), rubidium (Rb), cesium (Cs) or the transition metals silver (Ag) or thallium (Tl) and mixtures thereof, M is lead (Pb), tin (Sn), germanium (Ge), calcium (Ca), strontium (Sr), barium (Ba), any divalent transition metal or mixtures thereof, M' is bismuth (Bi), antimony (Sb) or mixtures thereof, and Q is sulfur (S), selenium (Se), or tellurium (Te) and mixtures thereof.

The variables n and m can be any number greater than zero. Preferably, n and m are integers. While the variables n and m can theoretically be any integer, preferably, n and m are between 1 and 20. Additionally, the ratio of cations to anions present in the compounds of the present invention will preferably be 1:1.

The compounds of the present invention can be synthesized utilizing at least two different groups of starting materials or from the pure elements themselves. According to one embodiment, the group of starting materials are $A_2Q$, M, M' and Q and under another embodiment the group of starting materials are $A_2Q$, $M'_2Q_3$, M and Q, wherein M and Q can be in the form of MQ as will be described below. In yet another embodiment, the pure elements, A, M, M' and Q, in the correct stoichiometric ratios can be used to synthesize the compounds of the present invention.

$A_2Q$ can be prepared by reacting stoichiometric amounts of the elemental A (2 moles) with the elemental Q (1 mole) in liquid ammonia. When the reaction is complete, the ammonia is removed by evaporation at ambient temperature. The resulting product is dried and ground to give a fine homogeneous powder.

$M'_2Q_3$ can be generally prepared by reacting stoichiometric amounts of elemental Bi or Sb (2 moles) and elemental Q (3 moles) at 800° C. for about 1–3 days at ambient pressure or optionally under a vacuum to reduce reaction times. Alternatively, bismuth telluride (Johnson Matthey/AESAR Group, Seabrook, N.H.) and bismuth selenide (Cerac, Inc, Milwaukee, Wis.) can be obtained commercially.

MQ can be synthesized, for example, by thoroughly mixing stoichiometric amounts (1 mole each) of elemental Pb, Sn, Ge, Ca, Sr, Ba, or any divalent transition metal and Q and loading the mixture into a quartz tube at a residual pressure of less than $10^{-4}$ Torr. The mixture is then heated to 800° C. over a 24 hour period and the temperature maintained for an additional 24 hours. The mixture is then cooled by quenching in water and the resulting ingot is crushed to a fine powder. The powder is then reloaded into a quartz tube and heated to 800° C. over a 24 hour period. The temperature of the mixture is maintained at 800° C. for an additional 24 hours and then slowly cooled to 300° C. at a rate of about 4° C./hr and subsequently to 50° C. over about 6 hours. The resulting ingots are ground to a fine powder prior to synthesis of the compounds of the present invention.

Upon forming each of the compounds included in the groups of starting materials, the isostructural compounds of the present invention are synthesized by thoroughly mixing and loading the chosen starting materials into a carbon coated quartz or capped graphite tube at a residual pressure less than $10^{-4}$ Torr, i.e., either the group of $A_2Q$, M metal, M' metal and elemental Q or the group $A_2Q$, $M'_2Q_3$ and MQ. The mixture is heated to 700° C. at a rate of about 30° C./hr. After maintaining the temperature at 700° C. for approximately 3 days, the mixture is cooled to 300° C. at a rate of 5° C./hr followed by cooling to 50° C. in about 12 hours. The resulting product is washed with degassed dimethylformamide and water in a nitrogen atmosphere. After further washing with diethyl ether and subsequent drying, the isostructural compounds of the present invention are obtained as shiny black chunks exhibiting the above described cubic phase.

The compounds of the present invention can al be synthesized from the pure elements. The appropriate elements for the desired compound, A, M, M' and Q, are mixed together in the correct stoichiometric ratios and sealed in a quartz tube under vacuum, i.e., $<10^{-3}$ Torr. The mixture is then heated in a direct flame until molten. Subsequent cooling of the melt yields the corresponding compound. To synthesize $KSnBiSe_3$, by way of non-limiting example, 0.01 mole (0.39g) of potassium, 0.01 mole (1.18 g) tin, 0.01 mole (2.09g) bismuth and 0.03 mole (2.37g) of selenium were mixed, placed in a quartz tube and sealed under vacuum at $<10^{-3}$ Torr. The mixture was heated in a direct flame until molten and subsequently cooled to yield the desired product, $KSnBiSe_3$.

As noted above, the isostructural compounds of the present invention have a cubic crystal lattice structure of the same type as NaCl, wherein the cations (or metals) occupy the Na sites and the anions occupy the Cl sites. The cations, although differing in charge, are similar in size and tend to become randomly dispersed throughout the structure as shown in FIG. 1. This cubic crystal structure is independent of the values for n and m and depends only on the elements selected to form the isostructural compounds. A property of this cubic structure of the compounds of the present invention is a morphology of low anisotropy which is desirable for fabricating electronic and optical devices, by way of non-limiting example. The cubic structure also gives rise to relatively high carrier mobilities and ease of crystal growth and processing. The compounds of the present invention also have relatively high melting point temperatures which are considered to be indicative of a high degree of structural stability. The melting temperatures of a significant number of the sample compounds of the present invention are greater than 850° C. (Table 1).

Figure 2A:
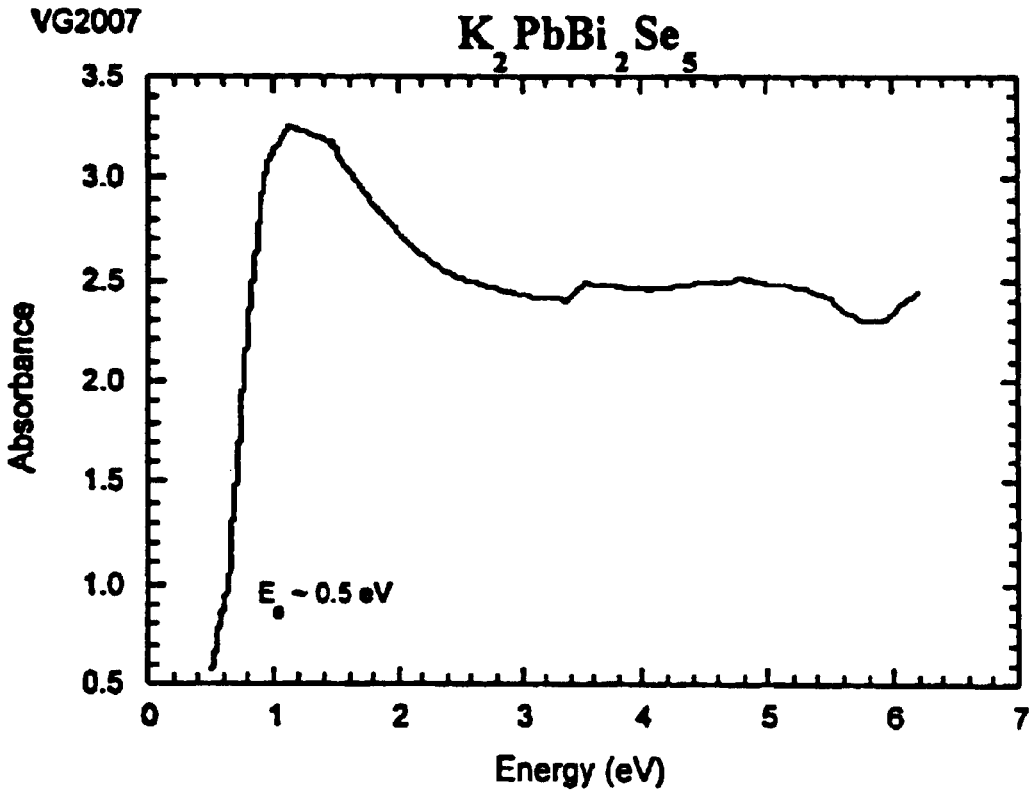
FIG. 2A is a graph showing the infrared absorption spectrum of $K_2PbBi_2Se_5$.
Figure 2B:
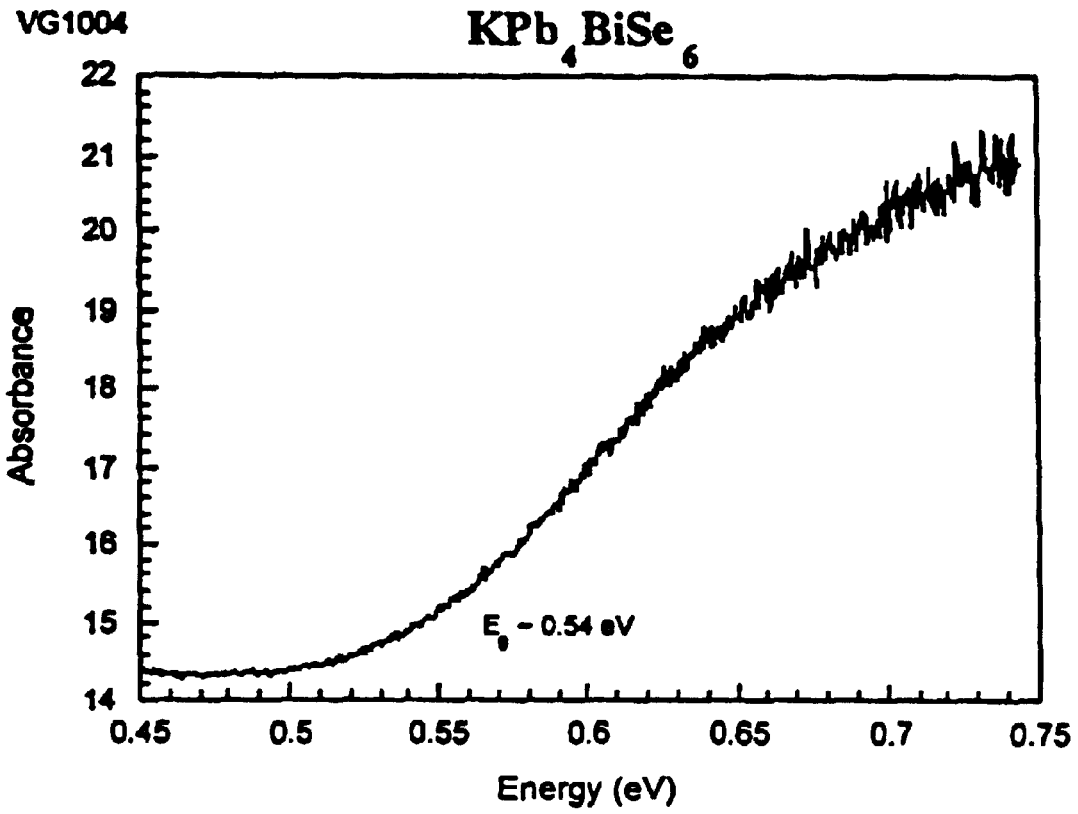
FIG. 2B is a graph showing the infrared absorption spectrum of $KPb_4BiSe_6$.
Figure 2C:
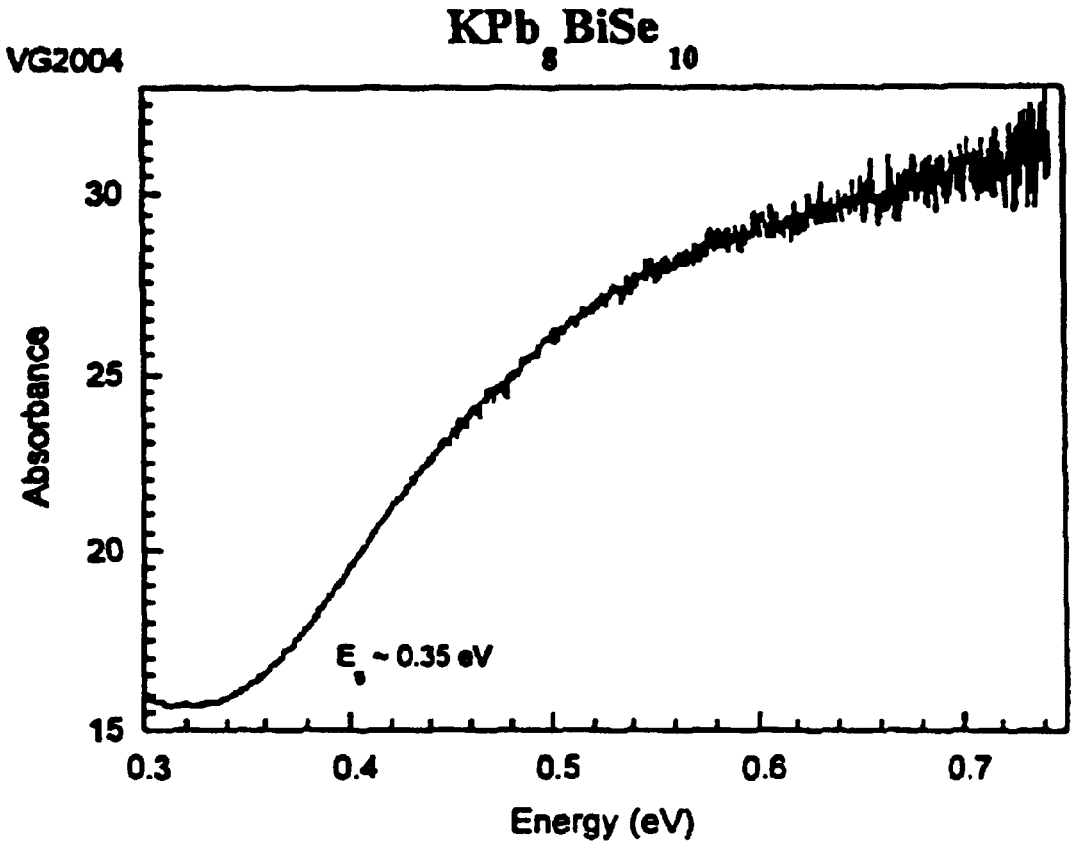
FIG. 2C is a graph showing the infrared absorption spectrum of $KPb_8BiSe_{10}$.
Figure 2D:
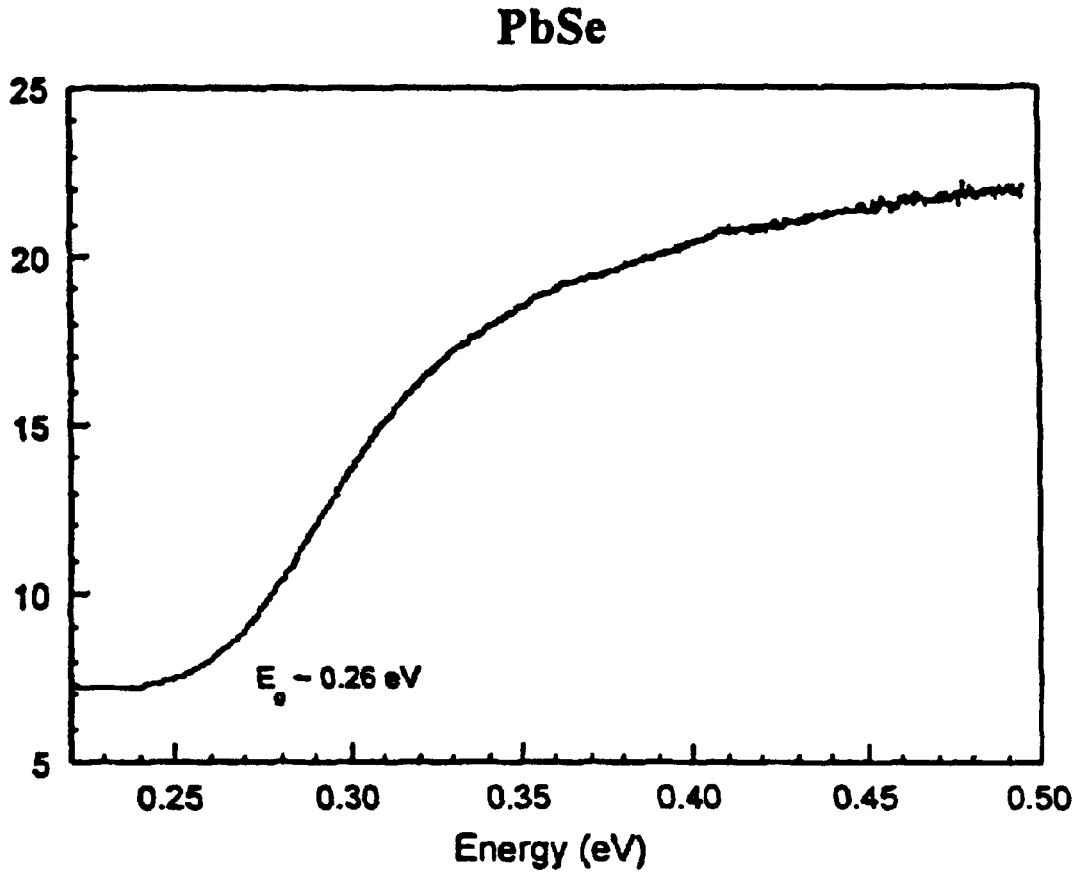
FIG. 2D is a graph showing the infrared absorption spectrum of PbSe.

The isostructural compounds of the present invention include band gaps which are tunable. By "band gaps" it is meant that there is an energy difference between the highest occupied electron state and the lowest unoccupied electron state in the isostructural compounds. Further, by "tunable" it is meant that this energy difference can be manipulated to obtain the desired band gap. One way of tuning the band gaps of the isostructural compounds is by varying the values of the n and m (Table 1). For example, the band gap of $KPbBiSe_3$ (n=1, m=1) was measured at ~0.60 eV which is in the desirable range for IR radiation detection. The compounds $K_2PbBi_2S_5$ (n=2, m=1) and $KPb_2BiS_4$ (n=1, m=2) have optical bands gaps of 1.1 and 0.76 eV respectively. Depending on the values for n and m in $A_nM_m M'_nQ_{2n+m}$ a relatively wide range of band-gaps is possible, i.e., from about 0.05 eV to 1.55 eV. Band gap values for other representative isostructural compounds are given in Table 1. Infrared spectra showing the band-gap transition are shown in FIGS. 2A–C. For comparison purposes, the infrared spectrum for PbSe, which is commonly used as an IR detector and has an NaCl-type cubic crystal lattice structure, is shown in FIG. 2D.

Another way of tuning the band gaps of the isostructural compounds of the present invention is by selecting certain cations and anions for A and Q, respectively. For example, if Se is chosen for Q and K is chosen for A, the isostructural compound $KPb_2BiSe_4$ has a band gap of 0.66 eV. If Q is changed from Se to Te, the corresponding compound $KPb_2BiTe_4$ has a band gap of less than 0.4 eV (Table 1). Depending on the application, appropriate band gaps can be chosen which would correspond to certain members of each family. One member of the family may be more appropriate for long wavelength detection, while another may be appropriate for short wavelength detection such as is used by IR lasers.

Yet another way of controlling the band gaps for the overall composition is by combining various individual isostructural compounds of the present invention to form solid solutions of the type (Li, Na, K, Rb, Cs, Ag, Tl)$_n$(Sn, Pb, Ge, Ca, Sr, Ba)$_m$(Bi, Sb)$_n$(S, Se, Te)$_{2n+m}$. By "solid solutions" what is meant is a single, solid, homogenous crystalline phase containing two or more chemical species. A so-called solid solution would be made up of at least two distinct chemical species such as $A_nPb_mBi_nSe_{2n+m}$ and $A_nPb_mBi_nTe_{2n+m}$ where Q represents two different anions (Sc and Te), or $K_nPb_mBi_nQ_{2n+m}$ and $Ag_nPb_mBi_nQ_{2n+m}$ where A now represents two different cations (K, Ag), by way of non-limiting example. Alternatively, M and M' may be represented by more than one element to form a solid solution. Examples of such compounds are, but not limited to, $AgPbBi_{0.75}Sb_{0.25}Te_3$, $AgPbBi_{0.5}Sb_{0.5}Te_3$, $AgPbBi_{0.75}Sb_{0.25}Te_3$, $AgPb_{0.75}Sn_{0.25}BiTe_3$, $AgPb_{0.5}Sn_{0.5}BiTe_3$, and $AgPb_{0.25}Sn_{0.75}BiTe_3$. Additional non-limiting examples of solid solutions are given in Table 1.

It will be appreciated that although fractional numbers are used for the mole ratios, they can be combined to give the integer value for n or m. For example, in $AgPb_{0.75}Sn_{0.25}BiTe_3$, Pb+Sn represent M and their combined mole fractions are equal to 1, the value for m.

While the n and m values in the pure isostructural compounds provide a coarse dial to control band-gap, the solid solutions give a final dial for band gap engineering. For example, $KPb_2BiSe_4$ has a band gap of 0.66 eV while $KPb_2BiTe_4$ has a band gap of less than 0.40 eV (Table 1). Therefore, solid solutions $KPb_2BiSe_3Te$, $KPb_2BiSe_2Te_2$ and $KPb_2BiSeTe_3$ will all have band gaps that fall somewhere between 0.66 and 0.40 eV. The formation of solid solutions with these compositions provides yet another means for tuning the band gap.

The isostructural compounds of the present invention can be used in optical applications including, for example, infrared and near infrared detectors, lasers and photovoltaic cells such as solar cells by way of non-limiting example. In optical applications, at least two materials having different band gaps are layered together to give the desired optical properties. The isostructural compounds of the present invention have a wide range of band gaps that can be finely tuned to give optimal performance in such optical applications. In addition, the lattice structures are identical, allowing for superior lattice matching of the layers compared to the layering of two compounds with varying structures.

Figure 3:
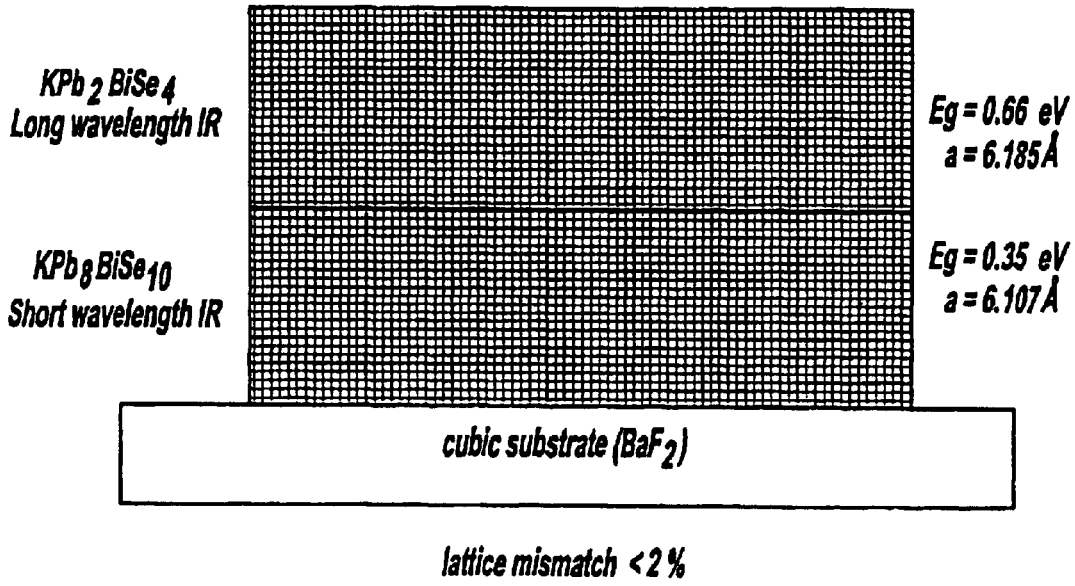
FIG. 3 is an illustration showing a multispectral sensor with a two-materials stacked structure.

The isostructural compounds of the present invention can also be used in multi-spectral sensors. Multi-spectral sensors (e.g. long wavelength and short wavelength) offer the possibility of improved clutter rejection and improved recognition range. The proper fusing of the information from each spectral band is key to the realization of these advantages. One such application is the two color, stacked, co-located, three terminal back-to-back diodes pixel. Two color, simultaneous integration HgCdTe back-to-back diodes staring IRFPAs have been produced. Love, P. et al., Proceedings of the IRIS Detectors Specialty Group Symposium, pp. 169–186 (1995). The materials of the present invention are well suited for this multispectral configuration because they provide lattice matching over a wide range of n and m. For example, a two-material stacked structure with $KPb_2BiSe4$ (Eg=0.66 eV) and $KPb_8BiSe_{10}$ (Eg=0.35 eV) can be built either by vapor deposition techniques or by fusion bonding of two individual crystals as illustrated in FIG. 3 along with the respective lattice constants, a. Current approaches using HgCdTe solid solutions (comprising HgTe and CdTe) require the growth of heterojunctions, which then requires precise lattice matching. Current techniques result in a lattice mismatch as great as 4–6%, compromising the performance of the multispectral sensor. In contrast, the isostructural compounds of the present invention can be utilized as individual compounds and therefore should not require precise compositional control at the junction. The lattice mismatch using the isostructural compounds of the present invention is significantly less than 4–6% and is <2% with $KPb_2BeSe_4$ and $KPb_8BiSe_{10}$ in a stacked structure (FIG. 3).

Another application for isostructural compounds of the present invention is in thermoelectric devices. Such devices may be used for heating, cooling, temperature stabilization, power generation and temperature sensing. Recently, significant advances in the synthesis and design of new systems such as in filled skutterudites and quantum well structures provided new hope that high performance thermoelectric materials may be attainable. While the efficiency of thermoelectric coolers operating near room temperature is only about 10% of Carnot efficiency, the thermodynamics of thermoelectric cooling suggests that achieving close to 100% of Carnot efficiency is possible employing the isostructural compounds of the present invention.

Thermoelectric devices are essentially heat pumps and power generators which follow the laws of thermodynamics in the same manner as mechanical heat pumps, refrigerators, or any other apparatus used to transfer heat energy. The principal difference is that thermoelectric devices function with solid state electrical components (thermocouples) as compared to more traditional mechanical/fluid heating and cooling components. An efficient thermoelectric device is fabricated from two materials, one N-type and the other a P-type conductor. Each material is separately chosen to optimize the figure of merit, zT, where $zT=(S^2\sigma/\kappa)T$; S is the thermopower or Seebeck coefficient (μV/K), σ the electrical conductivity (S/cm), κ the thermal conductivity (W/m–K) and T the temperature (K). Therefore, to obtain a thermoelectric material having a high thermoelectric performance, it is desirable to select a material having a large Seebeck coefficient, S, a large electrical conductivity, σ, and a small thermal conductivity, κ.

The isostructural compounds of the present invention have a high thermoelectric performance resulting from large Seebeck coefficients, large electrical conductivities and small thermal conductivities (Table 1). The Seebeck coefficients of the compounds of the present invention range from about ±30 μV/k to about ±500 μV/k and the electrical conductivities from about 10 to about 7000 S/cm.

Figure 4:
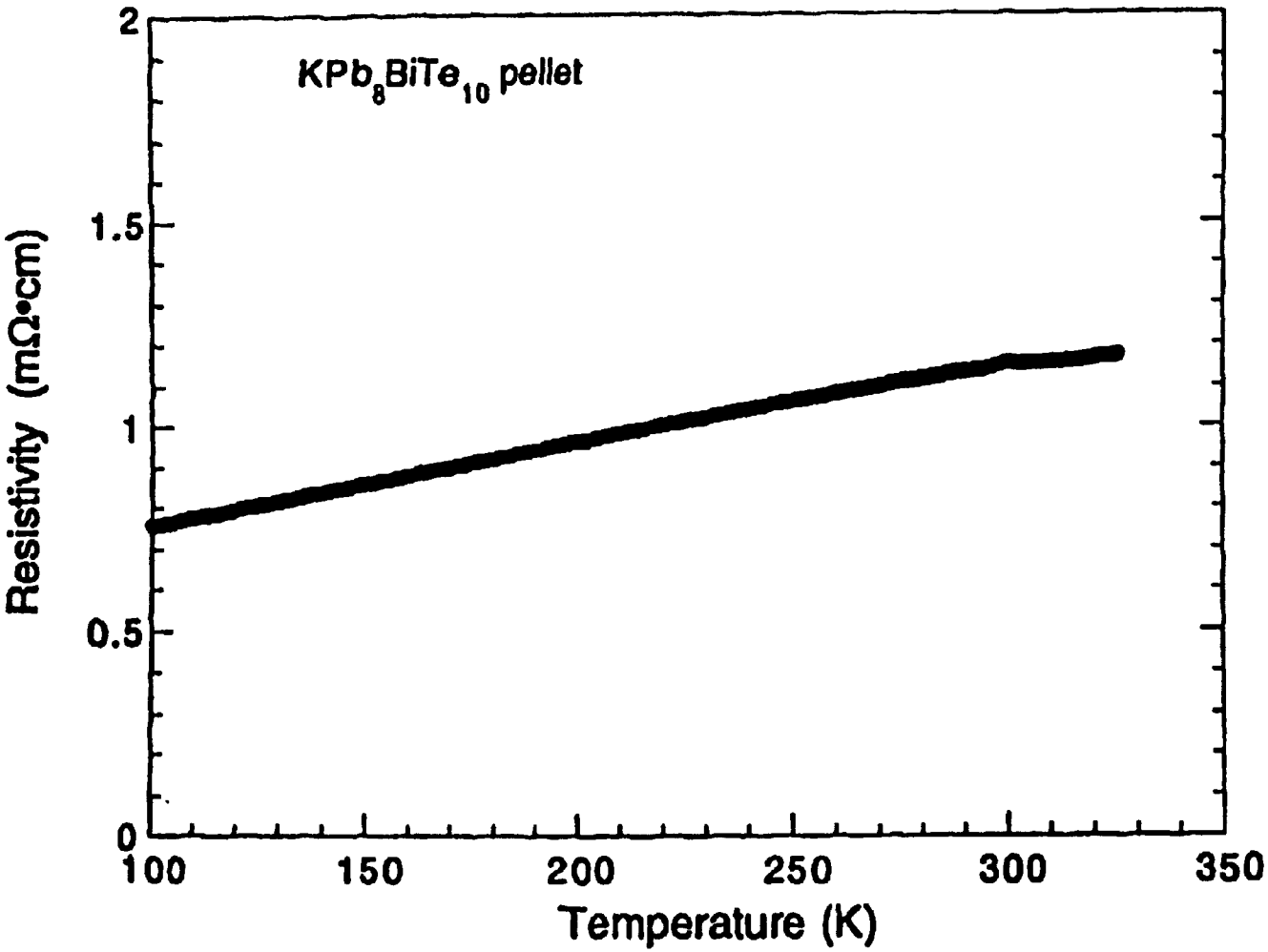
FIG. 4 is a graph showing the effect of increasing temperature on the resistivity of $KPb_8BiTe_{10}$.
Figure 5:
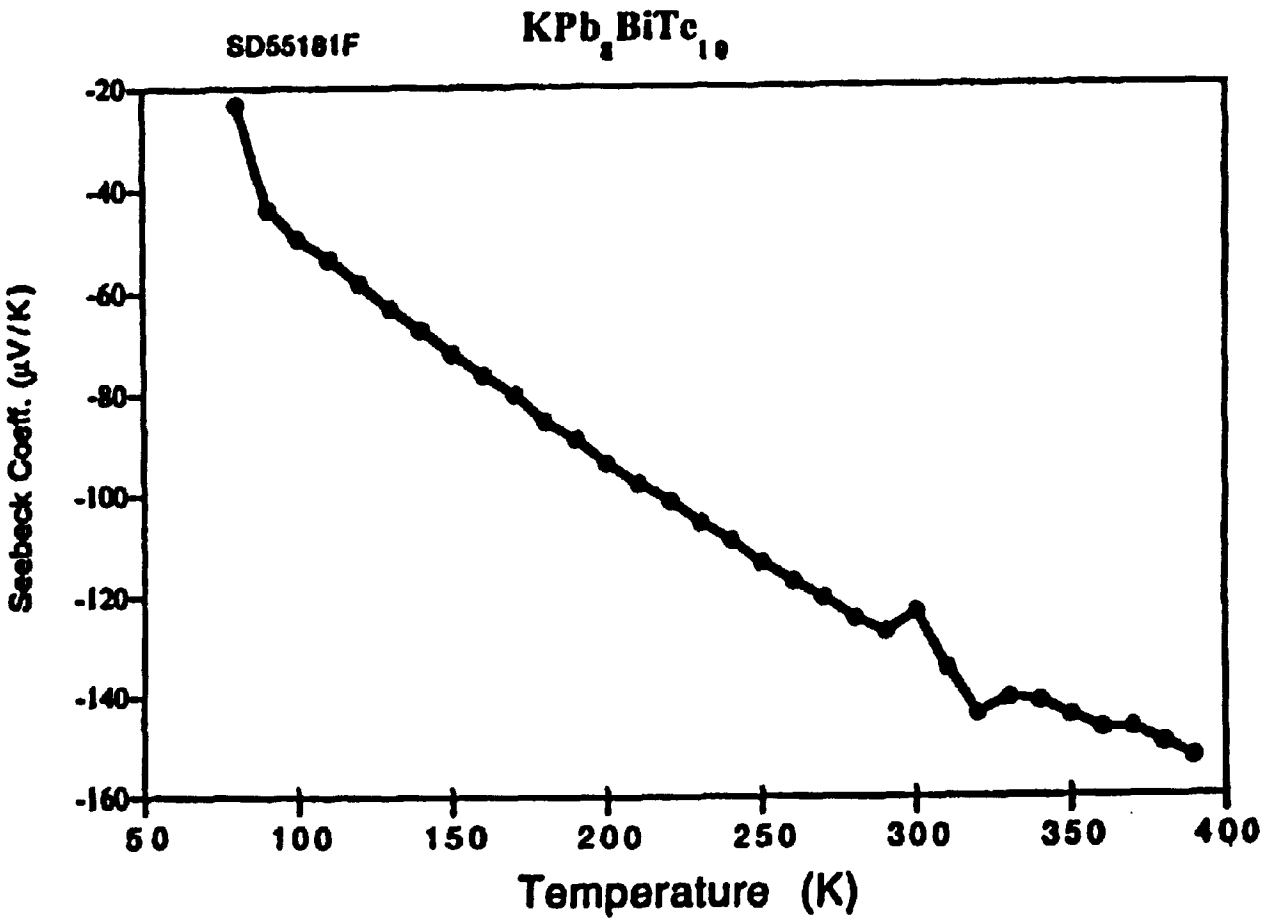
FIG. 5 is a graph showing the effect of increasing temperature on the Seebeck coefficient of $KPb_8BiTe_{10}$.

FIG. 4 shows the effect of increasing temperature on the inverse of electrical conductivity (resistivity) while FIG. 5 shows the effect of increasing temperature on the Seebeck coefficient of the compound $KPb_8BiTe_{10}$. Increasing the temperature results in a larger Seebeck coefficient.

The isostructural compounds of the present invention may be doped with selected impurities to produce P-type and N-type conductors having improved thermoelectric properties such as enhanced Seebeck coefficients and figures of merit (zT). In an enhanced N-type conductor, one atom is replaced by another atom having more valence electrons, wherein the extra electrons are not needed for bonding and are free to move throughout the crystal. Alternatively, a P-type conductor is formed when an atom in the isostructural compound is replaced by another atom with fewer electrons, leaving a bond vacant wherein this shortage is referred to as a hole.

The compounds of the present invention always exhibit P-type conductivity when the compounds are prepared by high temperature reaction with stoichiometric amounts of the constituent components. Enhanced P-type semiconductors can be produced from the compounds of the present invention. For the cationic sites of Bi or Sb (Group V) and Pb or Sn (Group IV), doping with one electron deficient elements such as Group IV elements (Ge, Sn, Pb) and Group III elements (Al, Ga, In, TI), respectively, may produce more hole carriers which give rise to improved electrical properties.

The isostructural components of the present invention can be used to produce N-type semiconductor materials by doping with various impurities. Isovalent anionic dopants, where S or Se is substituted for Te and S for Se may be used in about less than 1 atomic percent. Other examples of compounds that can be used for doping are the metal halides $SbX_3$, $BiX_3$, and $Hg_2Cl_2$, $DX_2$ where X is chlorine, bromine, iodine and mixtures thereof and D is chromium, manganese, iron, cobalt, nickel, copper, zinc, magnesium and mixtures thereof. These are examples of compounds that can be used for doping and are in no way meant to be limiting. It should be appreciated by those skilled in the art that any dopant can be used to dope the isostructural compounds of the present invention to form enhanced P-type and N-type semiconductors.

Doping of the isostructural compounds of the present invention can be achieved by introducing the desired amount of dopant during synthesis. Stoichiometric amounts of the dopant can be added to the starting materials. Alternately, the compounds of the present invention can be doped by co-melting the desired compound and the dopant and recooling the new mixture. The amount of dopant preferably ranges from 0.0001% to 4% by weight.

The isostructural compounds of the present invention may be used in a thermoelectrical conversion process in a thermoelectric conversion device. The thermoelectric conversion process using the isostructural compounds of the present invention may take any appropriate form, such as any known device and/or structure, as long as thermoelectric conversion principles are met. Such devices may be, but are not limited to, electrical power generators, heater, coolers, thermocouples, temperature sensors and radioisotope thermoelectric generators. Other thermoelectric devices that can be manufactured using the compounds of the present invention may be used in waste heat recovery systems, automobiles, remote power generators, temperature sensors and coolers for advanced electronic components such as field effect transistors, as non-limiting examples.

The isostructural compounds of the present invention may take any number of appropriate shapes. The compounds may be used in a lump shape or they may be formed in the shape of a thin film by a growth method, vapor deposition, or other techniques known to those skilled in the art. Regardless of the shape, the isostructural compounds of the present invention have excellent conductivity and thermoelectric properties.

TABLE 1

| Compound | n | m | Lattice Parameter (Å) | Band Gap (eV) | Melting Point ° C.) | $\kappa^a$ (W/m-K) | $\sigma^b$ (S/cm) | $S^c$ (μV/K) |
|---|---|---|---|---|---|---|---|---|
| $AgPbBiS_3$ | 1 | 1 | 5.753 | 0.54 | >910 | 1.3 | 25 | −160 |
| $AgPbBiSe_3$ | 1 | 1 | 5.955 | 0.48 | >920 | 1.0 | 67 | −130 |
| $AgPbBiTe_3$ | 1 | 1 | 6.28 | 0.28 | >900 | 1.15 | 300 | −40 |
| $AgPbSbTe_3$ | 1 | 1 | | | | | | |
| $AgSnBiTe_3$ | 1 | 1 | 6.1639 | | | | | |
| $AgPb_2BiTe_4$ | 1 | 2 | 6.323 | 0.29 | >850 | 1.2 | 180 | −165 |
| $AgSn_8BiSe_{10}$ | 1 | 8 | 5.926 | | >900 | 1.2 | | |
| $AgPb_{10}BiS_{12}$ | 1 | 10 | 6.117 | 0.31 | >900 | 1.1 | | |
| $AgPb_{10}BiTe_{12}$ | 1 | 10 | 6.452 | 0.29 | >850 | 1.1 | | |
| $AgPb_{10}SbTe_{12}$ | 1 | 10 | 6.441 | 0.29 | >850 | 1.0 | | |
| $AgPb_{10}BiSe_{12}$ | 1 | 10 | 6.118 | | | | | |
| $AgSn_{10}BiS_{12}$ | 1 | 10 | 6.259 | | | | 6700 | |
| $AgPb_{10}SbS_{12}$ | 1 | 10 | 5.905 | | | | 300 | |
| $AgPb_{13}BiTe_{15}$ | 1 | 13 | 6.44 | 0.23 | >800 | 1.6 | | |
| $AgPbBiTe_2Se$ | 1 | 1 | 6.185 | | | 1.3 | 400 | −58 |
| $AgPbBiTe_{2.25}Se_{0.75}$ | 1 | 1 | 6.19 | | | 1.1 | 150 | −40 |
| $AgPbBiTe_{2.5}Se_{0.5}$ | 1 | 1 | 6.247 | | | 1.6 | 77 | −80 |
| $AgPbBiTe_{2.75}Se_{0.25}$ | 1 | 1 | 6.274 | | | 1.15 | 133 | −105 |
| $AgPbBi_{0.1}Sb_{0.9}Te_3$ | 1 | 1 | | | | | | |

TABLE 1-continued

| Compound | n | m | Lattice Parameter (Å) | Band Gap (eV) | Melting Point ° C.) | κ[a] (W/m-K) | σ[b] (S/cm) | S[c] (μV/K) |
|---|---|---|---|---|---|---|---|---|
| $AgPbBi_{0.05}Sb_{0.95}Te_3$ | 1 | 1 | | | | | | |
| $AgPbBi_{0.75}Sb_{0.25}Te_3$ | 1 | 1 | 6.261 | 0.268 | | | 29 | −68 |
| $AgPbBi_{0.5}Sb_{0.5}Te_3$ | 1 | 1 | 6.261 | 0.27 | | | 3.91 | 250 |
| $AgPbBi_{0.25}Sb_{0.75}Te_3$ | 1 | 1 | | | | | 10 | 370 |
| $AgPb_{0.75}Sn_{0.25}BiTe_3$ | 1 | 1 | | 0.18 | | | 59 | −33 |
| $AgPb_{0.5}Sn_{0.5}BiTe_3$ | 1 | 1 | | | | | 310 | |
| $AgPb_{0.25}Sn_{0.75}BiTe_3$ | 1 | 1 | | | | | 685 | 35 |
| $AgPbBiTe_{1.5}Se_{1.5}$ | 1 | 1 | 6.13 | | | | | |
| $AgPbBiTeSe_2$ | 1 | 1 | 6.078 | | | | | |
| $AgPbBiTe_{0.5}Se_{2.5}$ | 1 | 1 | 6.036 | | | | | |
| $AgPbBiTe_{2.95}Se_{0.05}$ | 1 | 1 | 6.223 | | | | | −64 |
| $AgPbBiTe_{2.75}Se_{0.25}$ | 1 | 1 | 6.245 | | | | 666 | −60 |
| $AgPbSb_{0.95}Bi_{0.05}Te_3$ | 1 | 1 | | 0.37 | | | | 430 |
| $KPb_3BiS_5$ | 1 | 3 | 5.949 | 0.71 | >850 | | | |
| $K_5Pb_{16}Bi_5S_{26}$ | 5 | 16 | 5.947 | 0.69 | >850 | | | |
| $KPb_7BiS_9$ | 1 | 7 | 5.937 | 0.63 | >850 | | | |
| $KPb_9BiS_{11}$ | 1 | 9 | 5.947 | 0.53 | >850 | | | |
| $K_7PbBi_7S_{15}$ | 7 | 1 | 5.975 | 1.02 | >850 | | | |
| $K_8PbBi_8S_{17}$ | 8 | 1 | 6.006 | 1.24 | >850 | | | |
| $K_{11}PbBi_{11}S_{23}$ | 1 | 1 | 6.009 | 1.30 | >850 | | | |
| $KPbBiSe_3$ | 1 | 1 | 6.182 | 0.6 | 1004 | | | |
| $KPb_2BiSe_4$ | 1 | 2 | 6.185 | 0.66 | 958 | | | −515 |
| $KPb_3BiSe_5$ | 1 | 3 | 6.175 | 0.64 | 977 | | | 40 |
| $KPb_4BiSe_6$ | 1 | 4 | 6.154 | 0.56 | 1015 | | | 210 |
| $KPb_5BiSe_7$ | 1 | 5 | 6.142 | 0.45 | 1035 | | | 500 |
| $KPb_{10}BiSe_{12}$ | 1 | 10 | 6.112 | 0.32 | >850 | | | |
| $K_2Pb_{23}Bi_2Se_{27}$ | 2 | 23 | 6.111 | | >850 | | | |
| $K_2PbBi_2Se_5$ | 2 | 1 | 6.007 | 0.62 | >900 | | | |
| $K_3PbBi_3Se_7$ | 3 | 1 | 6.196 | 0.67 | >900 | | | |
| $KPbBiTe_3$ | 1 | 1 | | 0.45 | >900 | <1.5 | | −125 |
| $KPb_2BiTe_4$ | 1 | 2 | 6.469 | <0.40 | >900 | 1.7 | 700 | −115 |
| $KPb_3BiTe_5$ | 1 | 3 | 6.467 | <0.38 | >900 | 1.5 | 800 | |
| $KPb_4BiTe_6$ | 1 | 4 | 6.479 | <0.37 | >900 | 1.7 | 1000 | −155 |
| $KPb_8BiTe_{10}$ | 1 | 8 | 6.458 | <0.36 | >900 | 2.1 | 1100 | −150 |
| $KPb_{10}BiTe_{12}$ | 1 | 10 | 6.472 | <0.36 | >900 | 2.2 | 960 | −145 |
| $KPb_{10}BiSeS_{11}$ | 1 | 10 | 5.9815 | | | | | |
| $KPb_{10}BiSe_3S_9$ | 1 | 10 | 6.0199 | | | | | |
| $KPb_{10}BiSe_6S_6$ | 1 | 10 | 6.0635 | | | | | |
| $KPb_{10}BiSe_9S_3$ | 1 | 10 | 6.1055 | | | | | |
| $KPb_{10}BiSe_{11}S$ | 1 | 10 | 6.1336 | | | | | |
| $KPb_{10}Bi_{0.75}Sb_{0.25}Te_6Se_6$ | 1 | 10 | 6.3284 | | 935 | | 990 | |
| $KPb_{10}Bi_{0.5}Sb_{0.5}Te_6Se_6$ | 1 | 10 | 6.3073 | | 935 | | 595 | |
| $KPb_{10}Bi_{0.75}Sb_{0.25}Te_6Se_6$ | 1 | 10 | 6.2846 | 935 | 380 | | | |
| $KPb_8Sn_2BiTe_6Se_6$ | 1 | 10 | 6.2949 | | 860 | | 450 | |
| $KPb_6Sn_4BiTe_6Se_6$ | 1 | 10 | 6.27 | | 860 | | 40 | |
| $KPb_4Sn_6BiTe_6Se_6$ | 1 | 10 | 6.2544 | | 860 | | 100 | |
| $KPb_2Sn_8BiTe_6Se_6$ | 1 | 10 | 6.2094 | | 860 | | 360 | |
| $KPbSbTe_3$ | 1 | 1 | | | | | | |
| $KPb_5SbTe_7$ | 1 | 5 | 6.448 | | | | 13 | |
| $KPb_{10}SbTe_7$ | 1 | 5 | 6.459 | | | | 215 | |
| $KSnBiTe_3$ | 1 | 1 | | | | | 150 | |
| $KSn_5BiTe_7$ | 1 | 5 | | | | | 230 | |
| $KSn_{10}BiTe_{12}$ | 1 | 10 | 6.292 | | | | 990 | |
| $KSnSbTe_3$ | 1 | 1 | | | | | 210 | |
| $KSn_5SbTe_7$ | 1 | 5 | 6.278 | | | | 2630 | |
| $KSn_{10}SbTe_{12}$ | 1 | 10 | 6.363 | | | | 4250 | |

Although the present invention has been described in detail, it should be understood that various changes, substitutions and alterations can be made herein without departing from the spirit and the scope to the invention.

We claim:

1. A conductive material having the general formula $A_nM_mM'_nQ_{2n+m}$ wherein:

A is at least one element selected from the group consisting of Li, Na, K, Rb, Cs, and Tl;

M is at least one element selected from the group consisting of Pb, Sn, Ge, Ca, Sr, Ba and any divalent transition metal;

M' is at least one element selected from the group consisting of Bi and Sb;

Q is at least one element selected from the group consisting of Se, Te and S; and n and m are any number greater than 0.

2. The conductive material of claim 1 wherein n and m are integers.

3. The conductive material of claim 1 wherein the material possesses an NaCl-type cubic lattice structure.

4. The conductive material of claim 1 wherein A is K, M is Pb and M' is Bi.

5. The conductive material of claim 1 wherein A is K, M is Sn and M' is Bi.

6. A semiconductor device comprising the conductive material of claim 1.

7. An infrared detector comprising the conductive material of claim 1.

8. A photovoltaic element comprising the conductive material of claim 1.

9. A multispectral sensor comprising the conductive material of claim 1.

10. A thermoelectric device comprising the conductive material of claim 1.

11. A solid solution comprising a conductive material having the general formula $A_nM_mM'_mQ_{2n+m}$ wherein:

A is at least one element selected from the group consisting of Li, Na, K, Rb, Cs, and Tl;

M is at least one element selected from the group consisting of Pb, Sn, Ge, Ca, Sr, Ba and any divalent transition metal;

M' is at least one element selected from the group consisting of Bi and Sb;

Q is at least one element selected from the group consisting of Se, Te and S; and n and m are any number greater than 0.

12. The solid solution of claim 11 wherein Q is at least two elements selected from the group consisting of Se, Te and S.

13. The solid solution of claim 11 wherein M' is Bi and Sb.

14. The solid solution of claim 11 wherein M is at least two elements selected from the group consisting of Pb, Sn, Ge, Ca, Sr, Ba and any divalent transition metal.

15. The solid solution of claim 11 wherein the solid solution possesses a NaCl-type cubic lattice crystal structure.

16. A semiconductor device comprising the solid solution of claim 11.

17. An infrared detector comprising the solid solution of claim 11.

18. A photovoltaic element comprising the solid solution of claim 11.

19. A thermoelectric device comprising the solid solution of claim 11.

20. A P-type conductive material comprising:

(a) a conductive material having the general formula $A_nM_mM'_nQ_{2n+m}$ wherein:

A is at least one element selected from the group consisting of Li, Na, K, Rb, Cs, and Tl;

M is at least one element selected from the group consisting of Pb, Sn, Ge, Ca, Sr, Ba and any divalent transition metal;

M' is at least one element selected from the group consisting of Bi and Sb;

Q is at least one element selected from the group consisting of Se, Te, and S; and n and m are any number greater than 0; and (b) a dopant.

21. The P-type conductive material of claim 20, wherein the dopant is selected from the group consisting of Ge, Sn, Pb, Al, Ga, In, Ti and mixtures thereof.

22. An N-type conductive material comprising:

(a) a conductive material having the general formula $A_nM_mM'_nQ_{2n+m}$ wherein:

A is at least one element selected from the group consisting of Li, Na, K, Rb, Cs, and Tl;

M is at least one element selected from the group consisting of Pb, Sn, Ge, Ca, Sr, Ba and any divalent transition metal;

M' is at least one element selected from the group consisting of Bi and Sb;

Q is at least one element selected from the group consisting of Se, Te, and S; and n and m are any number greater than 0; and (b) a dopant.

23. The N-type conductive material of claim 22 wherein the dopant of a $SbX_3$, wherein X is a halide.

24. The N-type conductive material of claim 22 wherein the dopant is $BiX_3$, wherein X is a halide.

25. The N-type conductive material of claim 22 wherein the dopant is $Hg_2Cl_2$.

26. The N-type conductive material of claim 22 wherein the dopant is $DX_2$ where:

D is at least one element selected from the group consisting of Cr, Mn, Fe, Co, Ni, Cu, Zn and Mg; and X is at least one element selected from the group consisting of Cl, Br and I.

27. The N-type conductive material of claim 22 wherein the amount of dopant is from 0.0001% to 4% by weight.

28. A thermoelectric device comprising the N-type conductive material of claim 22.

29. A semiconductor device comprising the N-type conductive material of claim 22.

30. A solid solution comprising a conductive material having the general formula $A_nM_mM'_nQ_{2n+m}$ wherein:

A is at least two elements selected from the group consisting of Li, Na, K, Rb, Cs, Tl, and Ag;

M is at least one element selected from the group consisting of Pb, Sn, Ge, Ca, Sr, Ba and any divalent transition metal;

M' is at least one element selected from the group consisting of Bi and Sb;

Q is at least one element selected from the group consisting of Se, Te, and S; and

[n and m are any number greater than 0] *$0<n\leqq 1$ and $m\geqq 10$.*

31. The solid solution of claim 30 wherein Q is at least two elements selected from the group consisting of Se, Te and S.

32. The solid solution of claim 30 wherein M' is Bi and Sb.

33. The solid solution of claim 30 wherein M is at least two elements selected from the group consisting of Pb, Sn, Ge, Ca, Sr, Ba and any divalent transition metal.

34. A semiconductor device comprising the solid solution of claim 30.

35. An infrared detector comprising the solid solution of claim 30.

36. A photovoltaic element comprising the solid solution of claim 30.

37. A thermoelectric device comprising the solid solution of claim 30.

38. A conductive material having the general formula $A_nM_mM'_nQ_{2n+m}$ wherein:

A is at least one element selected from the group consisting of Li, Na, K, Rb, Cs, Tl, and Ag;

M is at least one element selected from the group consisting of Pb, Sn, Ge, Ca, Sr, Ba and any divalent transition metal;

M' is at least one element selected from the group consisting of Bi and Sb;

Q is at least one element selected from the group consisting of Se, Te, and S; and

[n and m are integers greater than 0] *$0<n\leqq 1$ and $m\geqq 10$.*

39. The conductive material of claim 38 wherein A is Ag, M is Pb and M' is Bi.

40. A semiconductor device comprising the conductive material of claim 38.

41. An infrared detector comprising the conductive material of claim 38.

42. A photovoltaic element comprising the conductive material of claim 38.

43. A multispectral sensor comprising the conductive material of claim 38.

44. A thermoelectric device comprising the conductive material of claim 38.

*45. A solid solution according to claim 30, wherein* $10 \leqq m \leqq 20$.

*46. A solid solution according to claim 45, wherein* $n=1$.

*47. A solid solution according to claim 30, wherein A comprises Ag.*

*48. A solid solution according to claim 47, wherein M is Pb, M' is Sb, Q is Te, and* $n=1$.

*49. A solid solution according to claim 30, additionally comprising an N-type or P-type dopant.*

*50. A conductive material according to claim 38, wherein* $n=1$.

*51. A conductive material to claim 38, wherein A is Ag.*

*52. A conductive material to claim 51, wherein M is Pb, M' is Sb, Q is Te, and* $n=1$.

*53. A conductive material according to claim 38, additionally comprising an N-type or P-type dopant.*

*54. A conductive material having the general formula* $Ag_nM_mM'_nQ_{2n+m}$, *wherein:*

(*a*) *M is at least one element selected from the group consisting of Pb, Sn, Ge, Ca, Sr, Ba and divalent transition metals;*

(*b*) *M' is at least one element selected from the group consisting of Bi and Sb;*

(*c*) *Q is at least one element selected from the group consisting of Se, Te and S; and*

(*d*) $n>0$ *and* $m \geqq 10$.

*55. A conductive material according to claim 54, wherein* $n \geqq 1$.

*56. A conductive material according to claim 54, wherein* $m \leqq 20$.

*57. A conductive material according to claim 56, wherein* $n=1$.

*58. A conductive material according to claim 54, wherein M is Pb, M' is Sb, and Q is Te.*

*59. A conductive material according to claim 58, wherein* $n=1$.

*60. A conductive material according to claim 54, additionally comprising an N-type or P-type dopant.*

*61. A semiconductor device comprising the conductive material of claim 54.*

*62. An infrared detector comprising the conductive material of claim 54.*

*63. A photovoltaic element comprising the conductive material of claim 54.*

*64. A thermoelectric device comprising the conductive material of claim 54.*

*65. An N-type conductive material comprising an N-type dopant and a conductive material having the general formula* $Ag_nM_mM'_nQ_{2n+m}$, *wherein:*

(*a*) *M is at least one element selected from the group consisting of Pb, Sn, Ca, Sr, Ba and divalent transition metals;*

(*b*) *M' is at least one element selected from the group consisting of Bi and Sb;*

(*c*) *Q is at least one element selected from the group consisting of Se, Te and S; and*

(*d*) $0<n \leqq 1$ *and* $m \geqq 10$.

*66. A conductive material according to claim 65, wherein* $n \geqq 1$.

*67. A solid solution according to claim 65, wherein* $m \leqq 20$.

*68. A conductive material according to claim 67, wherein* $n=1$.

*69. A conductive material according to claim 65, wherein M is Pb, M' is Sb, and Q is Te.*

*70. A conductive material according to claim 69, wherein* $n=1$.

*71. A semiconductor device comprising the conductive material of claim 65.*

*72. An infrared detector comprising the conductive material of claim 65.*

*73. A photovoltaic element comprising the conductive material of claim 65.*

*74. A thermoelectric device comprising the conductive material of claim 65.*

* * * * *

UNITED STATES PATENT AND TRADEMARK OFFICE

CERTIFICATE OF CORRECTION

PATENT NO. : RE 39,640 E
APPLICATION NO. : 10/703026
DATED : May 22, 2007
INVENTOR(S) : Mercouri G. Kanatzidis et al.

It is certified that error appears in the above-identified patent and that said Letters Patent is hereby corrected as shown below:

TITLE PAGE, Item (57), Abstract, line 2, "$O_{2n+m}$" should be --$Q_{2n+m}$--.

Column 2, line 45, "$O_{2n+m}$" should be --$Q_{2n+m}$--.

Column 3, line 6, "$O_{2n+m}$" should be --$Q_{2n+m}$--.

Column 3, line 26, "$O_{2n+m}$" should be --$Q_{2n+m}$--.

Column 4, line 32, "al" should be --also--.

Column 5, line 7, after "of", delete "the".

Column 5, line 43, "(Sc and Te)" should be --(Se and Te)--.

Column 5, line 60, "final" should be --fine--.

Column 6, line 27, "$KPb_2BiSe4$" should be --$KPb_2BiSe_4$--.

Column 8, Table 1, line 4 of heading, heading "Melting Point °C.)" should be --Melting Point (°C.)--.

Column 9, Table 1 continued, line 4 of heading, heading "Melting Point °C.)" should be --Melting Point (°C.)--.

Column 9, Table 1 continued, line 47, "935" under heading "Band Gap (eV)" should be under heading "Melting Point (°C.)".

Column 9, Table 1 continued, line 47, "380" under heading "Melting Point (°C.)" should be under heading "$\sigma^b$ (S/cm)".

UNITED STATES PATENT AND TRADEMARK OFFICE

CERTIFICATE OF CORRECTION

PATENT NO. : RE 39,640 E
APPLICATION NO. : 10/703026
DATED : May 22, 2007
INVENTOR(S) : Mercouri G. Kanatzidis et al.

It is certified that error appears in the above-identified patent and that said Letters Patent is hereby corrected as shown below:

Column 11, line 8, Claim 11, "$M'_m$" should be --$M'_n$--.

Column 12, line 22, Claim 30, delete "K,".

Column 13, line 18, Claim 51, after "*material*", insert --*according*--.

Column 13, line 19, Claim 52, after "*material*", insert --*according*--.

Signed and Sealed this

Seventh Day of April, 2009

JOHN DOLL
*Acting Director of the United States Patent and Trademark Office*